United States Patent [19]

Lein

[11] Patent Number: 5,243,379
[45] Date of Patent: Sep. 7, 1993

[54] EXPOSURE DRUM MASK

[75] Inventor: Juergen G. Lein, West Henrietta, N.Y.

[73] Assignee: A. B. Dick Company, Chicago, Ill.

[21] Appl. No.: 899,495

[22] Filed: Jun. 16, 1992

[51] Int. Cl.$^5$ .............................................. G03B 27/04
[52] U.S. Cl. ...................................... 355/85; 355/73; 355/91; 355/104; 355/110
[58] Field of Search ...................... 355/47, 73, 87, 91, 355/104, 110, 117, 274; 358/75, 401, 496; 101/389.1; 271/276

[56] References Cited

U.S. PATENT DOCUMENTS

| | | | |
|---|---|---|---|
| 4,262,594 | 4/1981 | Landsman | 101/382 MV |
| 4,298,278 | 11/1981 | Katakura et al. | 355/85 |
| 4,707,123 | 11/1987 | Ueyama | 355/73 |
| 4,739,361 | 4/1988 | Roy et al. | 355/73 X |
| 4,899,214 | 2/1990 | Robbins et al. | 358/75 |
| 4,949,129 | 8/1990 | Fowlkes et al. | 355/274 |
| 5,094,164 | 3/1992 | Kowalczyk et al. | 101/401.1 |
| 5,149,082 | 9/1992 | Morita | 271/276 |

*Primary Examiner*—Richard A. Wintercorn
*Attorney, Agent, or Firm*—Morgan & Finnegan

[57] ABSTRACT

A mask is used for mounting a sensitized sheet, such as a printing plate, onto the surface of an exposure drum. The mask, acting as an intermediary between the exposure drum and the printing plate, is a flexible sheet, with a top and bottom surface, that is mounted about the exposure drum. A groove formed within the top surface of the flexible sheet is used for securing the printing plate by means of a vacuum. A passageway formed within the flexible sheet connects the groove to the bottom surface and receives a vacuum from the exposure drum. Plates of different sizes are mounted to the exposure drum by interchangeable masks of corresponding sizes.

21 Claims, 8 Drawing Sheets

EXPOSURE DRUM MASK

FIELD OF THE INVENTION

This invention relates to the securing of sensitized sheets to exposure drums, and more particularly, to the use of a mask to facilitate the securing of sensitized sheets.

BACKGROUND OF THE INVENTION

An exposure drum provides a movable support surface for a lithographic plate, film, or other sensitized material, which is secured to the surface of the drum. The drum is rotated while the sensitized printing plate is imaged to form a particular image on the plate. The image may be formed by various techniques, such as a scanning LED array.

A prior system for securing sensitized material to a drum surface is shown in U.S. Pat. No. 4,899,214. The patent describes an exposure drum having grooves machined into the drum surface. A vacuum is drawn through the drum and grooves to hold the sensitized material onto the drum surface. This system is designed for use with sensitized material of a single size thus, aside from a lead edge groove, requiring only one groove pattern. If, however, sensitized material of a smaller size were placed on the drum surface then no substantially air-tight seal would be formed between the groove pattern and the sensitized material, thereby preventing the formation of a vacuum to secure the material onto the drum.

One proposal suggests machining a multitude of grooves onto the drum surface to accommodate differently sized plates. However, three problems arise with this proposal. First, the cost of machining the precision grooves is prohibitively high. Second, when a large sized plate is secured to the drum, several other sets of grooved patterns, adapted for securing smaller sized plates to the drum, lie beneath the portion of the plate where the image is being formed. Although no vacuum is applied to these other grooves, a vacuum is still formed within these grooves, causing the plate portion immediately above the grooves to be pulled nonuniformly against the mask. As a result, the image formed using such a system will be out of focus in the regions of the underlying grooves. Third, some groove patterns may cross each other, thus creating a sealing problem at the cross-over points.

The alternate method of replacing drums for each different plate size would be costly and impractical. Because of the exposure drum's mechanical complexity, considerable time and labor is required to replace the drum.

Therefore, prior systems are unable to adequately provide for the mounting of various sized plates onto the exposure drum.

SUMMARY OF THE INVENTION

It is therefore an object of the present invention to provide an interchangeable mask for holding a sensitized sheet, such as a lithographic plate, onto an exposure drum.

It is another object of the present invention to provide a set of interchangeable grooved masks according to a user's plate size needs.

It is another object of the present invention to provide a plate mounting system for holding different sized plates onto an exposure drum.

It is another object to eliminate the costly machining of a multitude of grooves onto a drum surface.

Yet another object of the invention is to produce a developed plate with no visible groove distortion in the imaged area.

A further object is to provide a mask which holds the plate with a uniform vacuum so that the plate makes firm contact with the mask and the latter makes good contact with the drum during the exposure.

It is still a further object of the present invention to provide a system for the automatic loading and unloading of a plate onto a mask covered drum.

The present invention comprises a mask for mounting a sensitized sheet onto an exposure drum. The mask includes a flexible sheet having a top surface and a bottom surface, where the flexible sheet is mounted about the exposure drum. A groove formed within the top surface of the flexible sheet is used for securing the sensitized sheet to the flexible sheet. A passageway formed within the flexible sheet fluidly connects the groove to the bottom surface of the flexible sheet and receives a vacuum from the exposure drum.

The present invention further comprises a mask for mounting a sensitized sheet onto an exposure drum including a first flexible sheet layer having a first central opening and a second flexible sheet layer having a second central opening. A central window of open mesh fabric permits airflow for securing the sensitized sheet to the exposure drum. The open mesh window is formed between the first and second flexible sheets, so that the window extends across the first and second central openings.

DESCRIPTION OF THE DRAWINGS

The invention will be described in greater detail below with reference to the attached drawings, of which.

DESCRIPTION OF THE PREFERRED EMBODIMENT

Figure 1:
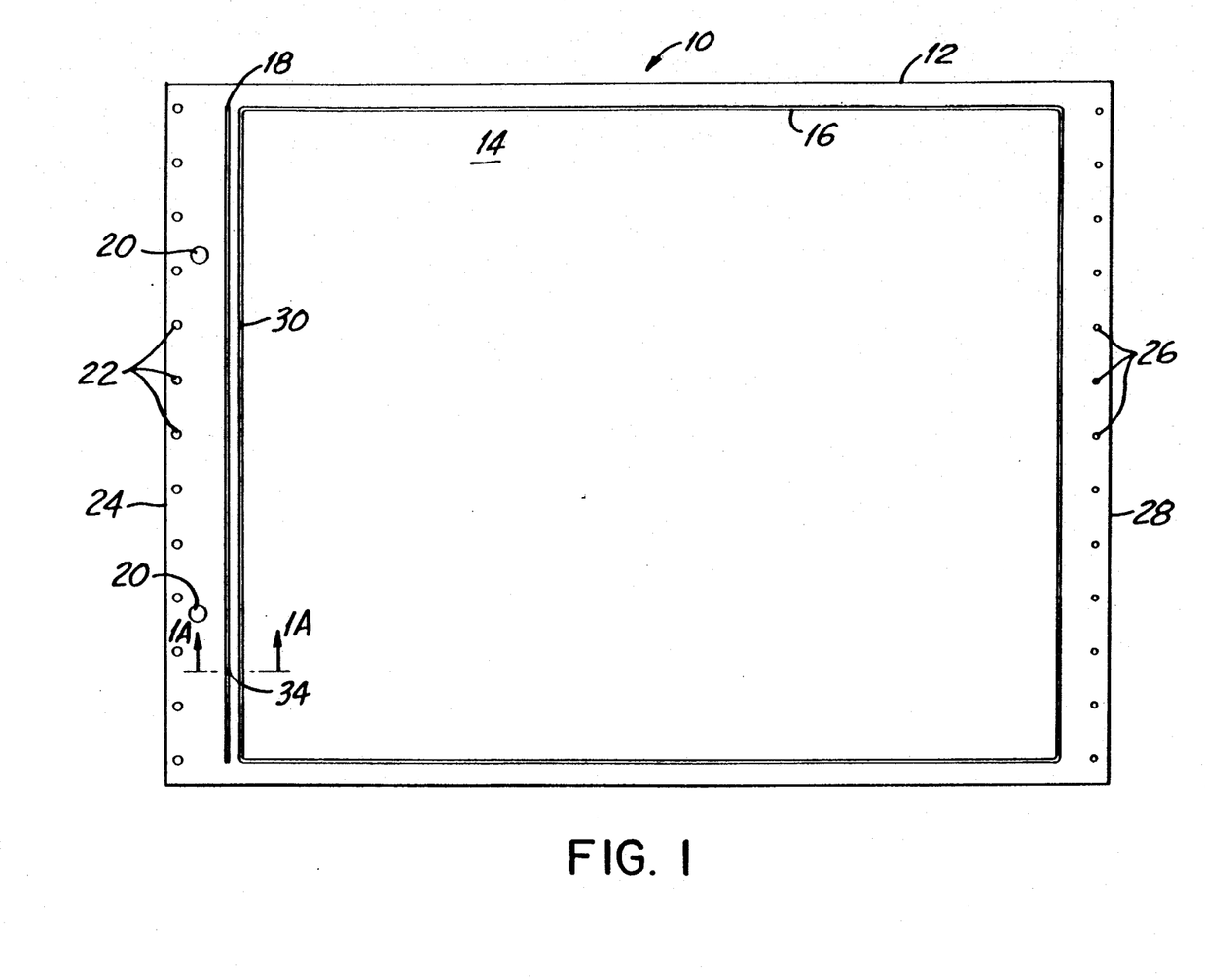
FIG. 1 is a top view of a mask for a large sized plate.
Figure 1A:
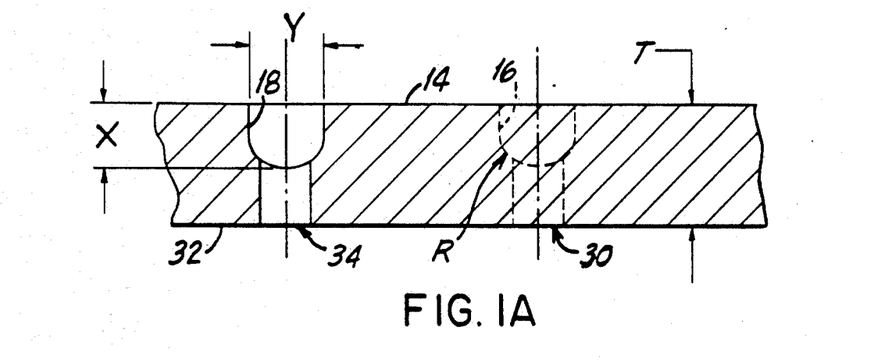
FIG. 1A is a cross-sectional view of the mask of FIG. 1 along the line 1A—1A.

Referring to FIGS. 1 and 1A, there is shown the preferred mask 10 of the present invention. A mask 10 is comprised of a flexible sheet 12 having a top surface 14 with a peripheral groove 16 and a gripper groove 18 formed in the top surface. Registration pin holes 20 are located adjacent gripper groove 18. A plurality of mounting holes 22 are located along the leading edge 24 of flexible sheet 12. Similarly, a plurality of tension holes 26 are located along the trailing edge 28 of flexible sheet 12. Flexible sheet 12 is preferably molded from polyurethane.

As shown in FIG. 1A, a first passageway 30 connects peripheral groove 16 to the bottom surface 32 of flexible sheet 12. A second passageway 34, connects gripper groove 18 to the bottom surface 32 of flexible sheet 12. Some typical groove dimensions of the mask 10 are as follows:

T = 100 mils;
X = 50 mils;
Y = 70 mils;
R = 35 mil radius.

Figure 2:
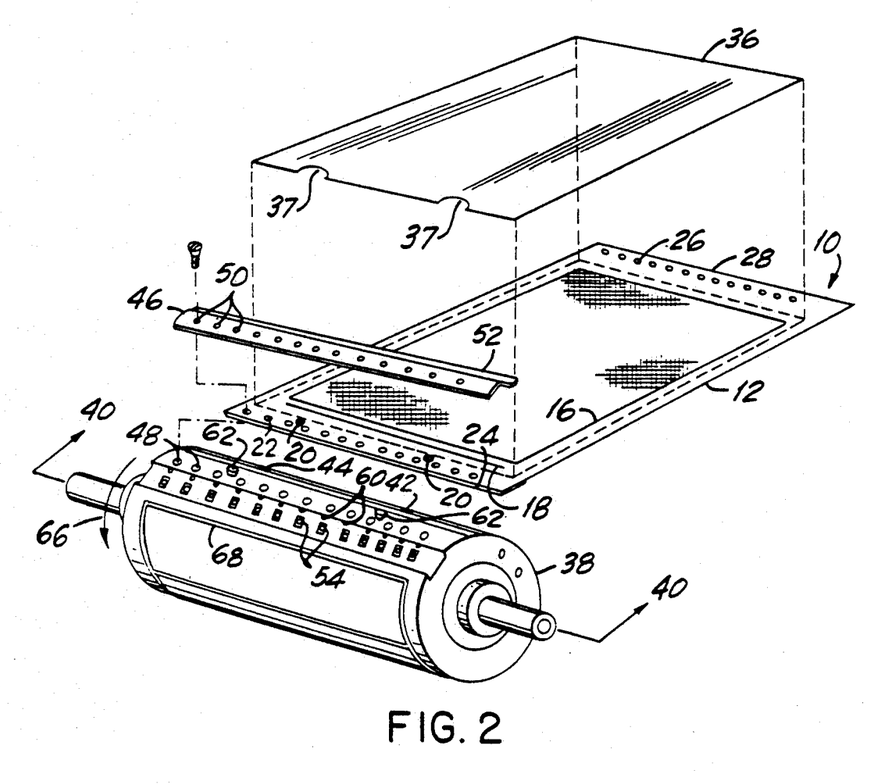
FIG. 2 is a perspective view of the exposure drum, mask, and plate assembly.

The mask 10 is an intermediary between a plate 36 and a substantially cylindrical exposure drum 38, as depicted in FIG. 2. The term plate as used herein is defined to mean a lithographic plate, film, or any other sensitized imaging material. Plates come in many different sizes. Some standard plate dimensions (inches) are listed below and correspond with A3 printing presses and their formats common to the markets in the United States, Europe and Japan. The image orientation on the plate is either "landscape" (L) or "portrait" (P).

| Plate Code | Plate Dimensions | Image Orientation |
| --- | --- | --- |
| E1 | 15.9 × 20.06 | L |
| E2 | 14.56 × 17.75 | L |
| E3 | 16.34 × 20.51 | L |
| E4 | 16.4 × 20.7 | L |
| US1 | 11.25 × 17.5 | P |
| US2 | 12.0 × 18.0 | P |
| US3 | 12.7 × 18.6 | P |
| US4 | 13.18 × 19.10 | P |
| US5 | 13.00 × 18.93 | P |

Figure 3:
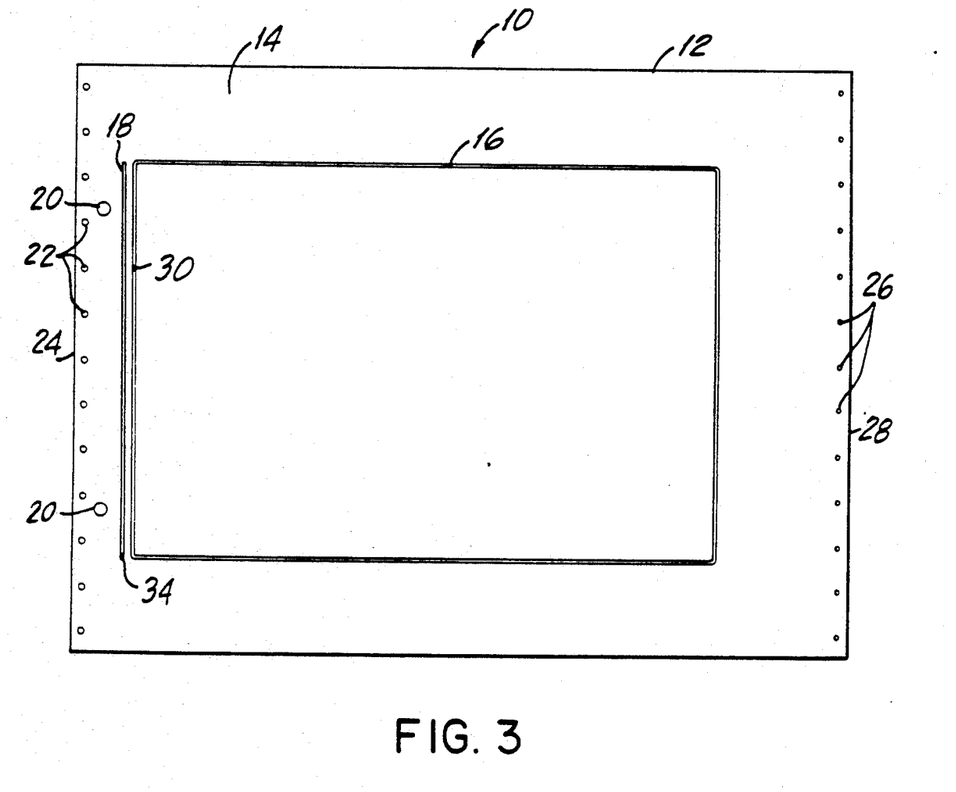
FIG. 3 is a top view of a mask for a smaller sized plate.

In the preferred embodiment, a vacuum source, such as a vacuum pump, indicated in FIG. 2 by arrows 40, is connected and supplies a vacuum via the interior of the exposure drum 38 to openings 42 and 44 on the surface of the drum. Gripper opening 44 supplies a vacuum to gripper groove 18 via second passageway 34. Peripheral opening 42 supplies a vacuum to peripheral groove 16 via first passageway 30. As shown in FIG. 3, the peripheral groove 16 lies slightly (e.g. 0.25 inch) within the circumference of plate 36. In this way a vacuum may be formed between the plate 36 and the mask 10. Furthermore, in the preferred embodiment no grooves lie beneath the area of the plate 36 which will be imaged, thus eliminating any distortion resulting from a vacuum being applied to the plate 36.

The mask 10 illustrated in FIG. 1 is intended for use with a large sized plate 36. The dimensions of the peripheral groove 16 approximate the dimensions of the flexible sheet 12. Similarly, the gripper groove 18 runs across almost the full width of flexible sheet 12.

Conversely, FIG. 3 illustrates a mask 10 intended for use with a smaller sized plate 36. As can be seen, peripheral groove 16 encompasses a smaller area than the mask 10 shown in FIG. 1. Likewise, gripper groove 18 runs across less than the full width of flexible sheet 12. In this way, a separate mask 10 is provided for each differently sized plate 36 to be used in the imaging system. However, in the preferred embodiment, for every mask 10 regardless of corresponding plate size, the locations of first passageway 30 and second passageway 34, remain the same. In this way, only a single pair of openings 42 and 44 on the drum surface are required for providing a vacuum to the grooves. The scope of the invention, however, encompasses the use of a plurality of drum openings for airflow.

Figure 4:
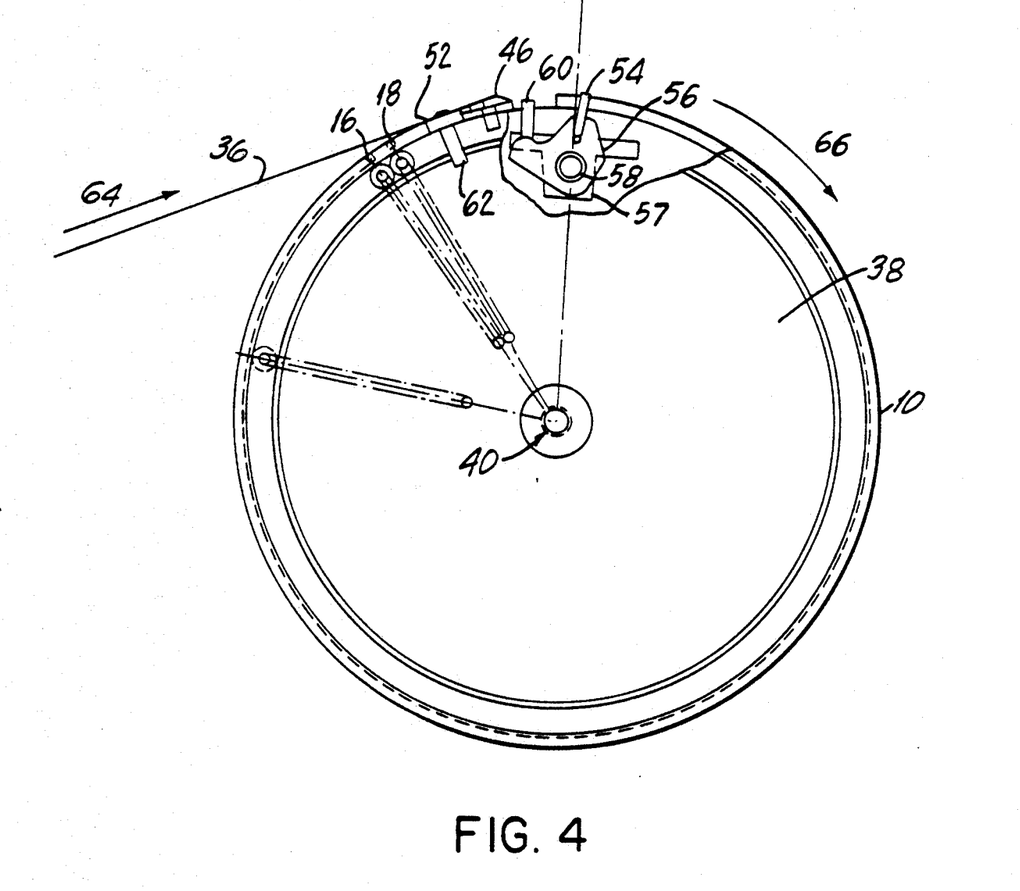
FIG. 4 is a schematic view of the exposure drum along its rotational axis, illustrating the tension adjuster.
Figure 5:
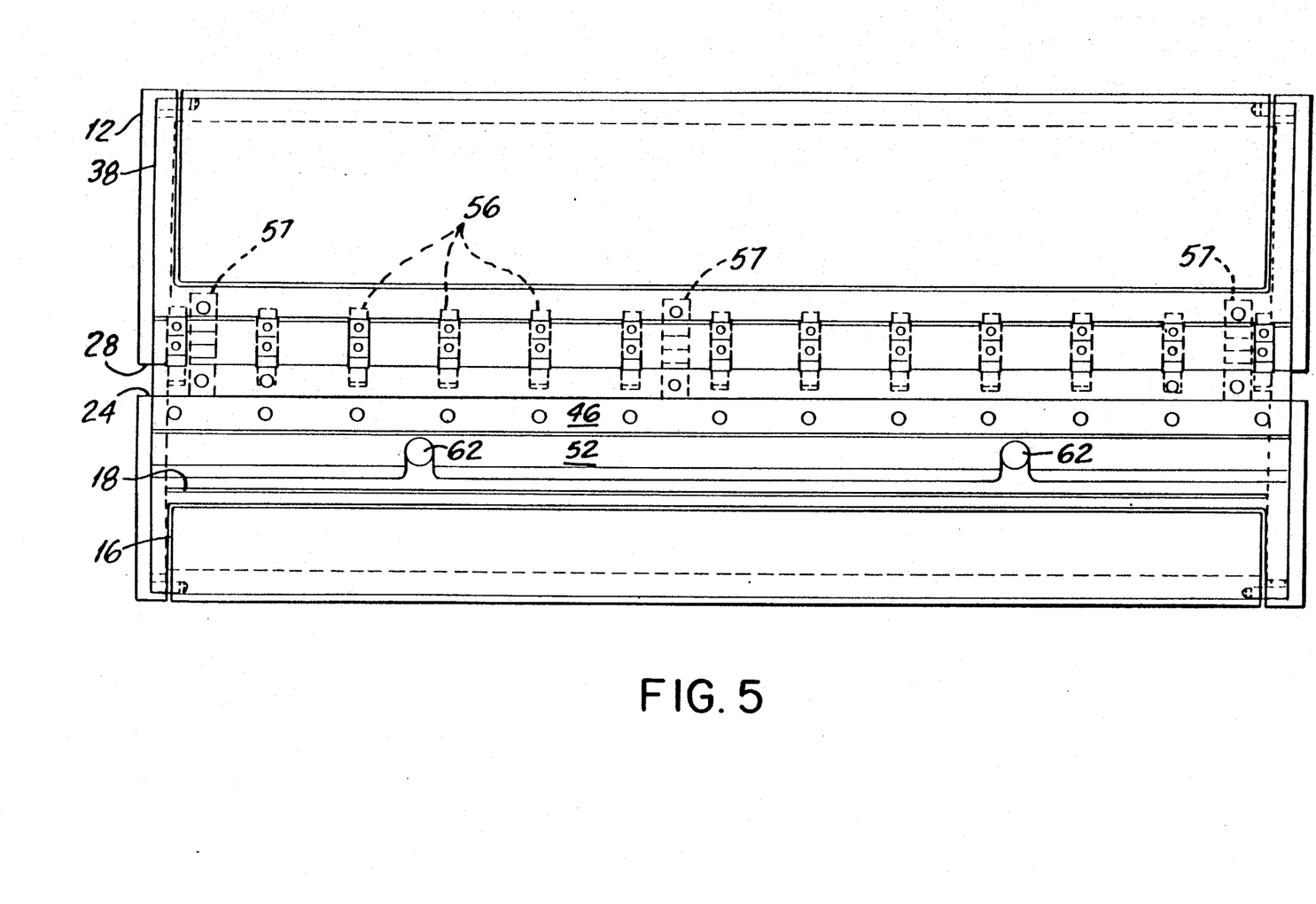
FIG. 5 is a top schematic view of the exposure drum and mask.
Figure 6:
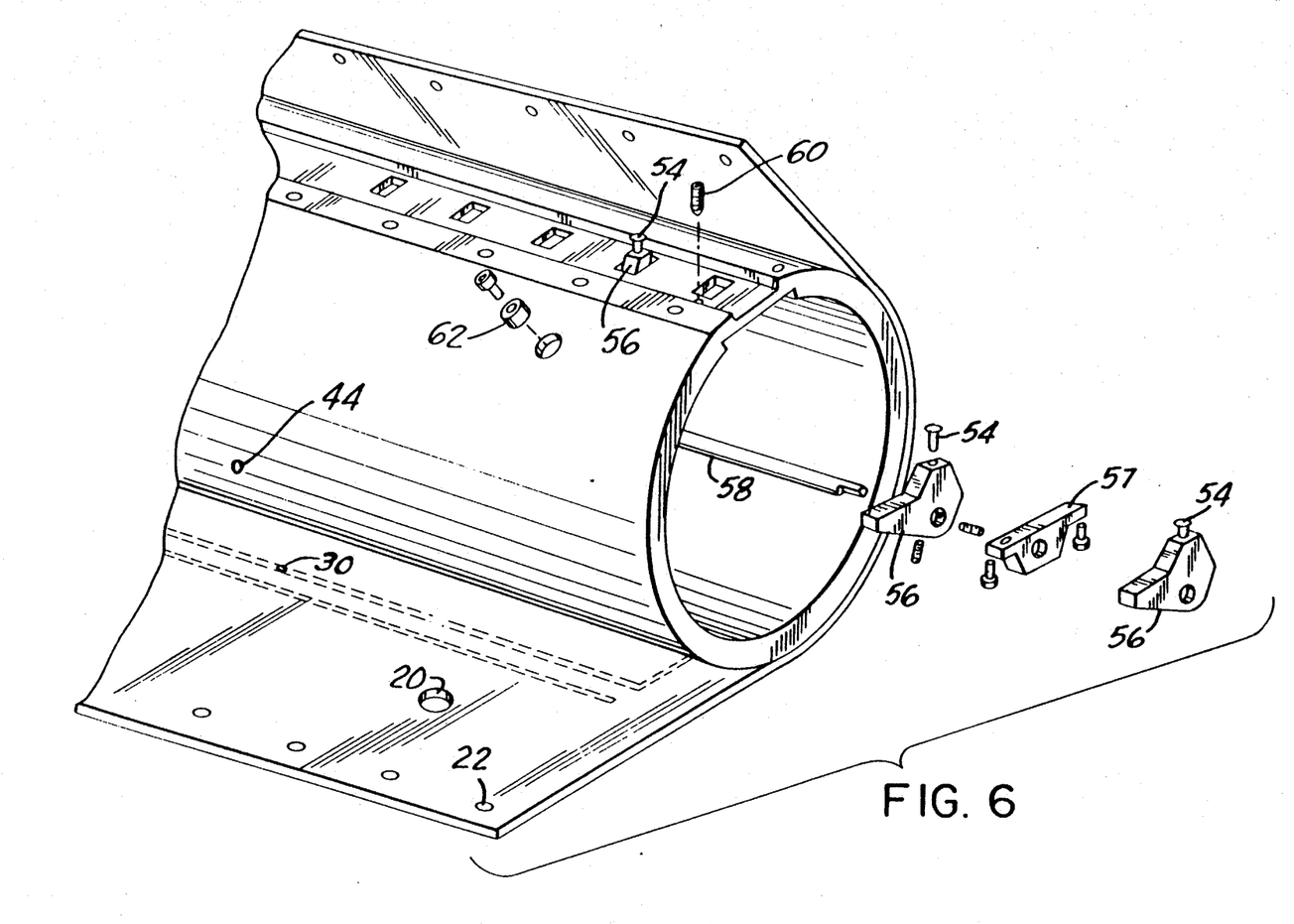
FIG. 6 is an exploded view of the exposure drum illustrating the tension adjustor.

FIGS. 2 and 4–6 illustrate the technique for mounting a mask 10 about the exposure drum 38. A mounting strip 46, preferably made of metal, secures the leading edge 24 of flexible sheet 12 to the drum 38. A plurality of holes 50 in the mounting strip 46 align with mounting holes 22 and with holes 48 in the drum 38, for conventional fastening. Preferably, the mounting strip 46 includes a guide 52, which may either be integral with the mounting strip or separately formed. The mask 10 wraps around the surface of the drum 38, so that tension holes 26 are placed over a plurality of tension pins 54 extending from slots in the drum surface. As shown in FIGS. 4 and 6, each tension pin 54 is connected to a tensioner block 56. The tensioner blocks 56 are mounted on a shaft 58. The shaft 58 is movably supported by three shaft mounting blocks 57. A tensioner screw 60 contacts each tensioner block 56 causing the tensioner block to rotate about shaft 58 and thereby moving tension pin 54 along the drum surface. Thus, the mask 10 moves along with the tension pins 54 so as to allow for adjusting the tension of the mask 10. A tension adjuster such as the one just described is desirable for preventing the movement of the plate 36 and mask 10 under the centrifugal forces of the fast rotating drum 38 The proper tensioning should be determined for each interchange of masks.

In addition to the tension adjuster, a pattern of drum grooves 68 which are connected to the vacuum source 40 may be used to further secure the mask 10 to the drum surface. The vacuum supplied to the various grooves are preferably independently controlled, for example, by solenoid valves in a pneumatic circuit (not shown).

In the preferred embodiment, shown in FIG. 5, a pair of registration pins 62 extend from the drum surface and through the registration pin holes 20 in the mask 10. The registration pins 62 provide accurate two point alignment of the plate 36 when the lead edge of the plate 36 has notches 37, shown in FIG. 2, which fit around the registration pins 62.

The loading of plate 36 onto the drum/mask combination is illustrated in FIG. 4. The plate 36 is automatically fed in the direction of arrow 64 so that its lead edge fits into the space created by guide 52. Preferably, the plate 36 has previously been punched to create notches 37 so that the front edge may properly register with registration pins 62. The exposure drum is slowly rotated in the direction of arrow 66 and the vacuum source 40 is operating. A vacuum is applied to gripper groove 18 so as to secure the lead edge of the plate 36. The plate supply continues to feed the plate 36 onto the surface of the drum 38, while maintaining tension on the plate. Typically, pressure rollers (not shown) will be pressing the plate 36 against the drum surface. Furthermore, at some point during the first rotation the plate 36 may be cut to length by a rotary cutter (not shown). A vacuum is applied to the peripheral groove 16 and the drum is rotated through several rotations to ensure that all air is evacuated from the existing interfaces. The drum 38 is then brought up to a high rotational speed so that scanning exposure may begin. At high speeds, guide 52 provides an air foil effect, deflecting air away from the lead edge of the plate 36, so that the plate is not lifted off mask 10.

Figure 7:
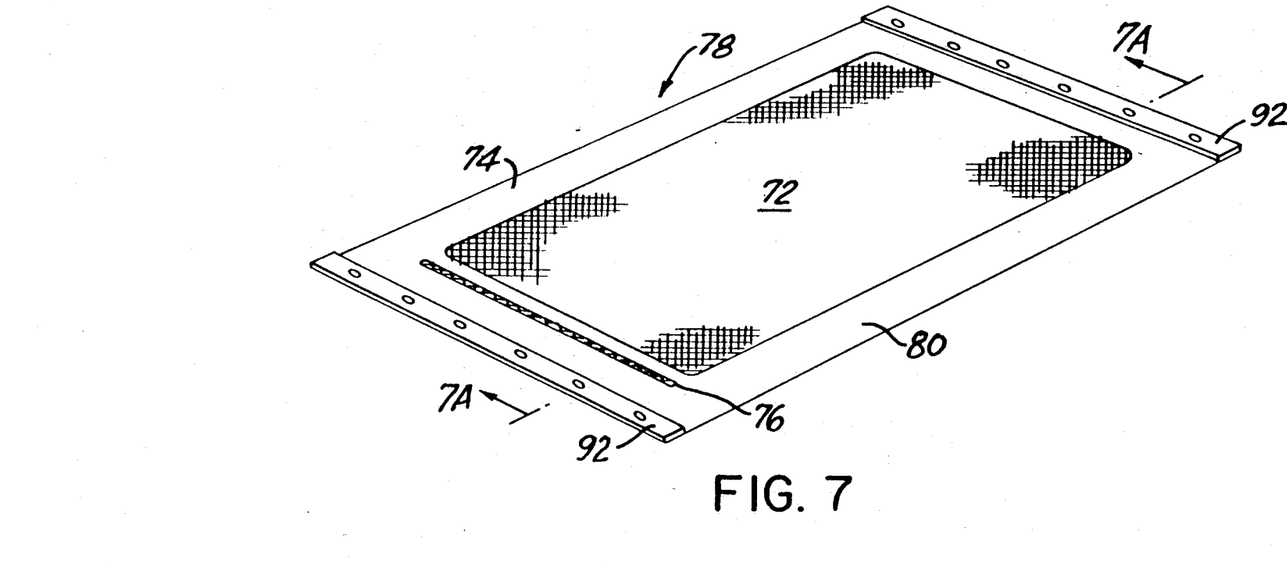
FIG. 7 is a perspective view of an alternative embodiment of the mask of the present invention.
Figure 7A:
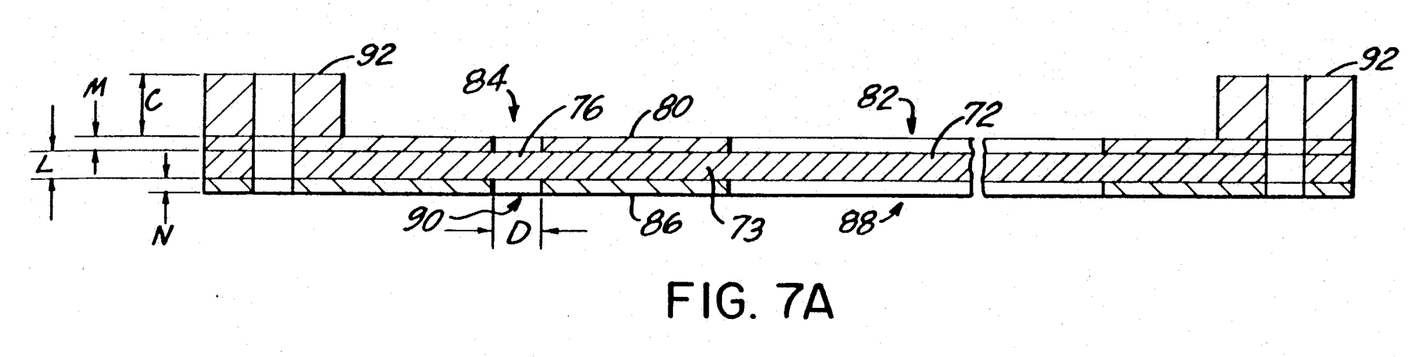
FIG. 7A is a cross-sectional view of the mask of FIG. 7 along the line 7A—7A.

Another embodiment of the present invention is shown in FIGS. 7 and 7A. A central window 72, formed of open mesh fabric, is located in a central opening of bordering flexible sheet 74. A gripper window 76, also formed of open mesh fabric, is located in a gripper opening of bordering flexible sheet 74. The windows permit airflow and provide a uniform vacuum when a plate 36 is placed over a window. The purpose and operation of the modified mask 78 of this embodiment is the same as for the preferred embodiment which employs grooves for forming the vacuum.

Mask 78 is preferably formed by lamination. A first flexible sheet layer 80 has a first central opening 82 and a first gripper opening 84. A second flexible sheet layer 86 similarly has a second central opening 88 and a second gripper opening 90. A layer of open mesh fabric 73, such as black polyester fabric, is placed between first flexible sheet layer 80 and second flexible sheet layer 86 so as to extend across the central openings 82, 88 and the gripper openings 84, 90. The two flexible sheet layers are then laminated together so as to fasten the open mesh fabric between the sheets and thus form central window 72 and gripper window 76. The first and second flexible sheet layers are preferably formed of plastisol.

The flexible sheet layers of mask 78 should be thin in order to avoid image distortion around the periphery of the plate. It is desirable to reinforce mask 78 with clamp bars 92 attached to the leading and trailing edges. The clamp bars 92 are preferably formed of metal. Some typical layer dimensions of mask 78, shown in FIG. 7A (not drawn to scale) are as follows:

C = 62 mils;
D = 130 mils;
L = 10 mils;
M = 5 mils;
N = 5 mils.

Figure 8:
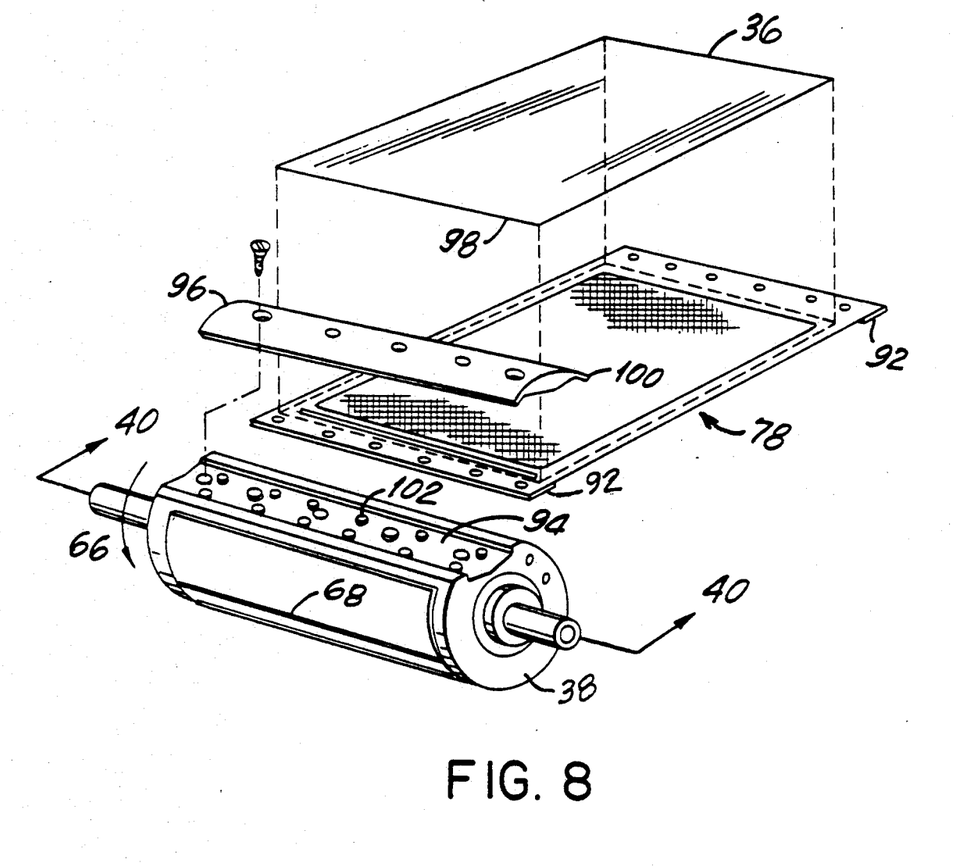
FIG. 8 is a perspective view of the exposure drum, mask, and plate assembly used in the alternative mask embodiment.

FIG. 8 shows a drum mounting technique which may be used with mask 78. Clamp bars 92 fit within a recess 94 in the surface of exposure drum 38, in connection with locator pins 102. Clamp-insert 96 is secured over clamp bars 92 to the drum 38. With this configuration, the leading edge 98 of plate 36 may be registered with the edge 100 of clamp-insert 96. As with the mounting technique described in connection with mask 10, a pattern of drum grooves 68, which are connected to vacuum source 40, may be used to further secure the mask 78 to the drum surface.

While, a gripper groove 18 or a gripper window 76 are preferable features of the present invention, the scope of the invention is not limited by their presence.

Although the invention has been described in detail above by way of reference to the drawings and the preferred embodiment, it should be understood that the invention is not limited to the embodiments described herein but should be interpreted in accordance with the claims that follow.

I claim:

1. A mask for mounting a sensitized sheet onto an exposure drum comprising:
    a flexible sheet, having a top surface and a bottom surface, for mounting about the exposure drum;
    a groove formed within the top surface of the flexible sheet for securing the sensitized sheet; and
    a passageway formed within the flexible sheet, fluidly connecting the groove to the bottom surface of the flexible sheet for receiving a vacuum from the exposure drum.

2. The mask of claim 1, wherein the flexible sheet is polyurethane.

3. The mask of claim 1, wherein the groove is dimensioned to lie within and approximate the circumferential dimensions of the sensitized sheet when the mask is mounted onto the exposure drum.

4. A mask for mounting a sensitized sheet onto an exposure drum comprising:
    a flexible sheet, having a top surface and a bottom surface, for mounting about the exposure drum;
    a gripper groove formed within the top surface of the flexible sheet for securing a lead edge of the sensitized sheet;
    a peripheral groove formed within the top surface of the flexible sheet for securing the sensitized sheet;
    a first passageway formed within the flexible sheet, fluidly connecting the gripper groove to the bottom surface of the flexible sheet for receiving a vacuum from the exposure drum;
    a second passageway formed within the flexible sheet, fluidly connecting the peripheral groove to the bottom surface of the flexible sheet for receiving a vacuum from the exposure drum; and
    means for mounting the flexible sheet onto the exposure drum.

5. The apparatus of claim 4, wherein the flexible sheet is polyurethane.

6. The apparatus of claim 4, wherein the peripheral groove is dimensioned to lie within and approximate the circumferential dimensions of the sensitized sheet when the mask is mounted onto the drum.

7. A method for mounting a sensitized sheet onto an exposure drum comprising:
    mounting a flexible sheet, having a top surface and a bottom surface, where the top surface has a groove that is in fluid communication with the bottom surface via a passageway, onto an exposure drum, so that the passageway on the bottom surface is in fluid communication with an opening in the exposure drum, for receiving a vacuum;
    applying a vacuum to the groove through the passageway and through the opening in the exposure drum;
    feeding a sensitized sheet onto the exposure drum; and
    rotating the exposure drum so that the sensitized sheet wraps around the flexible sheet, and a vacuum seal is formed between the sensitized sheet and the flexible sheet.

8. The method of claim 7, wherein the flexible sheet is polyurethane.

9. The method of claim 8, wherein the step of mounting a flexible sheet onto an exposure drum includes the steps:
    clamping a first end of the flexible sheet onto the exposure drum with a mounting strip, where the bottom surface of the flexible sheet is in contact with the exposure drum and the top surface of the flexible sheet is in contact with the mounting strip;
    wrapping the flexible sheet around the exposure drum;
    connecting a second end of the flexible sheet to a plurality of movable pins, where the pins are on tensioner blocks; and manipulating the tensioner blocks so as to move the pins and vary the tension on the flexible sheet to a desired amount.

10. The method of claim 7, wherein the step of rotating the exposure drum so that the sensitized sheet wraps around the flexible sheet comprises:

rotating the drum at a first slow speed so that initially a gripper groove in the top surface of the flexible sheet secures a first edge of the sensitized sheet; and rotating the drum at a second fast speed after the sensitized sheet has been wrapped about the flexible sheet, so that imaging of the sensitized sheet may be commenced.

11. A mask for mounting a sensitized sheet onto an exposure drum comprising:

a flexible sheet having a central opening, for mounting about the exposure drum; and a window of open mesh fabric extending across the central opening, that permits airflow, for receiving a vacuum from the exposure drum and for securing the sensitized sheet.

12. The mask of claim 11, wherein the flexible sheet is plastisol.

13. The mask of claim 11, wherein the window of open mesh fabric is dimensioned to lie within and approximate the circumferential dimensions of the sensitized sheet when the mask is mounted onto the drum.

14. A mask for mounting a sensitized sheet onto an exposure drum comprising:

a first flexible sheet layer having a first central opening;

a second flexible sheet layer having a second central opening; and a central window of open mesh fabric which permits airflow, for receiving a vacuum from the exposure drum and for securing the sensitized sheet, where the central window is fastened between the first and second flexible sheet layers, so that the central window extends across the first and second central openings.

15. The mask of claim 14, wherein the first and second flexible sheet layers are plastisol.

16. The mask of claim 14, wherein the central window is dimensioned to lie within and approximate the circumferential dimensions of the sensitized sheet when the mask is mounted onto the exposure drum.

17. The mask of claim 14, further comprising a gripper window of open mesh fabric for securing a leading edge of the sensitized sheet, where the gripper window is fastened between the first and second flexible sheet layers, so that the gripper window extends across a first gripper opening in the first flexible sheet layer and across a second gripper opening in the second flexible sheet layer.

18. A sensitized sheet mounting system comprising:

an exposure drum;

a flexible sheet, having a top surface and a bottom surface, for mounting about the exposure drum;

a groove formed within the top surface of the flexible sheet for securing the sensitized sheet; and a channel formed within the flexible sheet, fluidly connecting the groove to the bottom surface of the flexible sheet for receiving a vacuum from the exposure drum.

19. The sensitized sheet mounting system of claim 18, wherein the exposure drum further comprises a tension adjuster for mounting the flexible sheet onto the exposure drum at a desired tension.

20. The sensitized sheet mounting system of claim 19, wherein the tension adjustor comprises:

a mounting strip for engaging a first end of the flexible sheet;

a plurality of tensioner blocks rotatably mounted to the exposure drum;

a plurality of pins for engaging a second end of the flexible sheet, where each pin is connected to a tensioner block, and where each pin movably extends above the surface of the exposure drum; and means for actuating the tensioner blocks for moving the pins along the surface of the exposure drum so as to adjust the tension of the sensitized sheet.

21. A sensitized sheet mounting system comprising:

an exposure drum;

a flexible sheet having a central opening, for mounting about the exposure drum;

a window of open mesh fabric extending across the central opening, for receiving a vacuum from the exposure drum and for securing the sensitized sheet;

a pair of clamp bars connected to the leading and trailing edges of the flexible sheet; and means for mounting the flexible sheet onto the exposure drum.

* * * * *